US010768290B2

(12) United States Patent
Lin et al.

(10) Patent No.: US 10,768,290 B2
(45) Date of Patent: Sep. 8, 2020

(54) METHOD AND APPARATUS FOR GENERATING A FREQUENCY ESTIMATION SIGNAL

(71) Applicant: NXP B.V.

(72) Inventors: Yu Lin, Utrecht (NL); Erwin Janssen, Veldhoven (NL); Konstantinos Doris, Eindhoven (NL); Vladislav Dyachenko, Eindhoven (NL); Athon Zanikopoulos, Riethoven (NL)

(73) Assignee: NXP B.V., Eindhoven (NL)

( * ) Notice: Subject to any disclaimer, the term of this patent is extended or adjusted under 35 U.S.C. 154(b) by 238 days.

(21) Appl. No.: 15/835,186

(22) Filed: Dec. 7, 2017

(65) Prior Publication Data
US 2018/0164420 A1 Jun. 14, 2018

(30) Foreign Application Priority Data
Dec. 13, 2016 (EP) .................................... 16203729

(51) Int. Cl.
*G01S 13/34* (2006.01)
*G06F 1/02* (2006.01)
(Continued)

(52) U.S. Cl.
CPC .......... *G01S 13/341* (2013.01); *G01S 13/342* (2013.01); *G06F 1/022* (2013.01); *H03D 7/1433* (2013.01);
(Continued)

(58) Field of Classification Search
CPC ........ G01S 13/341; G01S 13/342; H03J 3/04; G01R 23/04; H03D 7/1433; H03D 7/1458; H03D 7/1466; G06F 1/022
(Continued)

(56) References Cited

U.S. PATENT DOCUMENTS 4,316,259 A * 2/1982 Albrecht ................. G06F 1/022
                                                708/270
5,262,714 A * 11/1993 Friedman ............... G01R 23/02
                                                324/76.15
(Continued)

FOREIGN PATENT DOCUMENTS

WO     2010/045348 A1    4/2010

OTHER PUBLICATIONS

Search Opinion on EP16203729.5, dated May 26, 2017 (Year: 2017).*

(Continued)

*Primary Examiner* — Frank J McGue
(74) *Attorney, Agent, or Firm* — Rajeev Madnawat

(57) ABSTRACT

A frequency estimation signal generator component arranged to receive an input frequency signal and to generate therefrom a frequency estimation signal. The frequency estimation signal generator component comprises a counter component arranged to sequentially output a sequence of control signal patterns over a plurality of digital control signals under the control of an oscillating signal derived from the received input frequency signal terns. The frequency estimation signal generator further comprises a continuous waveform generator component arranged to receive the plurality of digital control signals and a weighted analogue signal for each of the received digital control signals, and to output a continuous waveform signal comprising a sum of the weighted analogue signals for which the corresponding digital control signals comprise an asserted logical state. The frequency conversion component is arranged to derive the frequency estimation signal from the continuous waveform signal output by the continuous waveform generator component.

15 Claims, 8 Drawing Sheets

(51) Int. Cl.
  *H03D 7/14* (2006.01)
  *H03J 3/04* (2006.01)
  *G01R 23/04* (2006.01)

(52) U.S. Cl.
  CPC ......... *H03D 7/1458* (2013.01); *H03D 7/1466* (2013.01); *G01R 23/04* (2013.01); *H03J 3/04* (2013.01)

(58) Field of Classification Search
  USPC .......................................................... 342/87
  See application file for complete search history.

(56) References Cited

U.S. PATENT DOCUMENTS

| | | | |
|---|---|---|---|
| 6,690,153 B2 | 2/2004 | Aue | |
| 8,508,213 B2 | 8/2013 | Todorokihara | |
| 9,026,403 B2 | 5/2015 | Todorokihara | |
| 2001/0052806 A1* | 12/2001 | Gu | H03L 7/0895 327/157 |
| 2018/0048339 A1* | 2/2018 | Wu | H04B 1/109 |

OTHER PUBLICATIONS

Reuter, R. "77 GHz Radar Solutions FTF-AUT-F0292", Freescale / NXP, 28 pgs., retrieved from the internet at: https://www.nxp.com/files-static/training_pdf/WBNR_FTF11_AUT_F0292.pdf?&lang_cd=en (Jun. 2011).

Analog Filter Wizard, Analog Devices, 1 pg., retrieved from the internet Jan. 29, 2020 at: http://www.analog.com/designtools/en/filterwizard/.

Kugelstadt, T. Chapter 16—Ä́ctive Filter Design Techniques", Texas Instruments, 66 pgs., retrieved from the internet at: https://www2.seas.gwu.edu/~ece121/Spring-11/filterdesign.pdf" (Dec. 2003).

Stoica, P. et al. "Spectral Analysis of Signals—Chapter 1", 41 pgs., Prentice Hall, retreived from the internet at: http://user.it.uu.se/~ps/SAS-new.pdf (2005).

* cited by examiner (c) Output waveform of the proposed architecture (d) Spectrum of the proposed architecture output waveform

METHOD AND APPARATUS FOR GENERATING A FREQUENCY ESTIMATION SIGNAL

CROSS-REFERENCE TO RELATED APPLICATIONS

This application claims the priority under 35 U.S.C. § 119 of European Patent application no. 16203729.5, filed on Dec. 13, 2016, the contents of which are incorporated by reference herein.

FIELD OF THE INVENTION

This invention relates to a method and apparatus for generating frequency estimation signal, and in particular to a frequency estimation signal generator component arranged to receive an input frequency signal and to generate therefrom a frequency estimation signal in digital form.

BACKGROUND OF THE INVENTION

In Frequency-Modulated Continuous Wave (FMCW) automotive radar systems, the frequency of the transmitted signal is controlled by a voltage controlled local oscillator (VCO) and accurate run time monitoring of the VCO frequency is crucial for such systems.

In a FMCW automotive radar system, the transmitted signal (e.g. a 76 to 77 GHz mm-Wave sine wave with linear frequency modulation chirp) is controlled by a voltage controlled oscillator (VCO). In such a system, one of the mandatory functions is the ability for run-time monitoring of the VCO frequency with sufficient accuracy for the purpose of built-in self-test and functional safety requirements of automotive applications. A conventional approach to monitoring VCO frequency is illustrated in FIG. 1. Firstly the frequency of the VCO output signal 110 (e.g. ~27 GHz) is scaled down by a clock divider 120 (e.g. by a factor of 512, to a frequency around 50 MHz). The output signal 125 of the divider 120 is filtered 130 to remove its harmonics from its fundamental signal. After that, the filtered signal 135 is digitized by an analogue-to-digital converter (ADC) 140 for further digital signal processing to estimate the frequency of the VCO output signal 110.

A problem with this conventional approach for monitoring the frequency of a VCO output signal is that the output waveform 125 of the divider 120 is a square wave (or a heavily distorted sine wave), and so it has very strong harmonic tones close to the fundamental tone (especially the third order harmonic tone). In order to estimate the frequency of the VCO output signal 110 accurately, these harmonics of the divider output signal 125 need to be sufficiently filtered out in accordance with the system requirements, which can require a very complex high order analogue filter in order to have enough suppression of the harmonics to fulfil stringent accuracy requirements. For example, in a FMCW automotive radar system, the requirements for the analogue filter may be:

passband: 45-55 MHz, ripple <2 dB; and
stopband: attenuation >70 dB for f>150 MHz.

The 70 dB suppression on the $3^{rd}$ harmonic is a tough specification and a 9th order Butterworth filter is typically required to achieve such suppression. For such a complex filtering function, it is very difficult and cost ineffective to be implemented in advance CMOS technology due to the noise, bandwidth and linearity performance typically required resulting in large power and area penalties to implement. Consequently, such a complex filtering function is typically implemented on a separate chip with a dedicated technology, often based on Cauer or Sallen-Key topologies and requiring many bulky passive components or multiple high gain and low noise amplifiers as well as calibration or trimming to maintain the desired filter characteristics over PVT (process voltage temperature) variations.

SUMMARY OF THE INVENTION

The present invention provides a frequency estimation signal generator component, a frequency monitor circuit for performing run-time frequency monitoring of an input signal and a method of generating a frequency estimation signal for performing run-time frequency monitoring of an input frequency signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

The present invention will now be described with reference to the accompanying drawings. However, it will be appreciated that the present invention is not limited to the specific embodiments herein described and as illustrated in the accompanying drawings, and that various modifications may be made without departing from the inventive concept.

Figure 1:
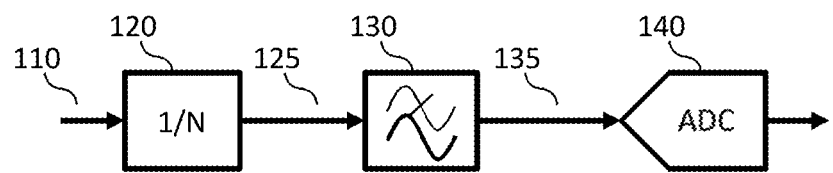
FIG. 1 schematically illustrates a conventional approach to monitoring VCO frequency.
Figure 2:
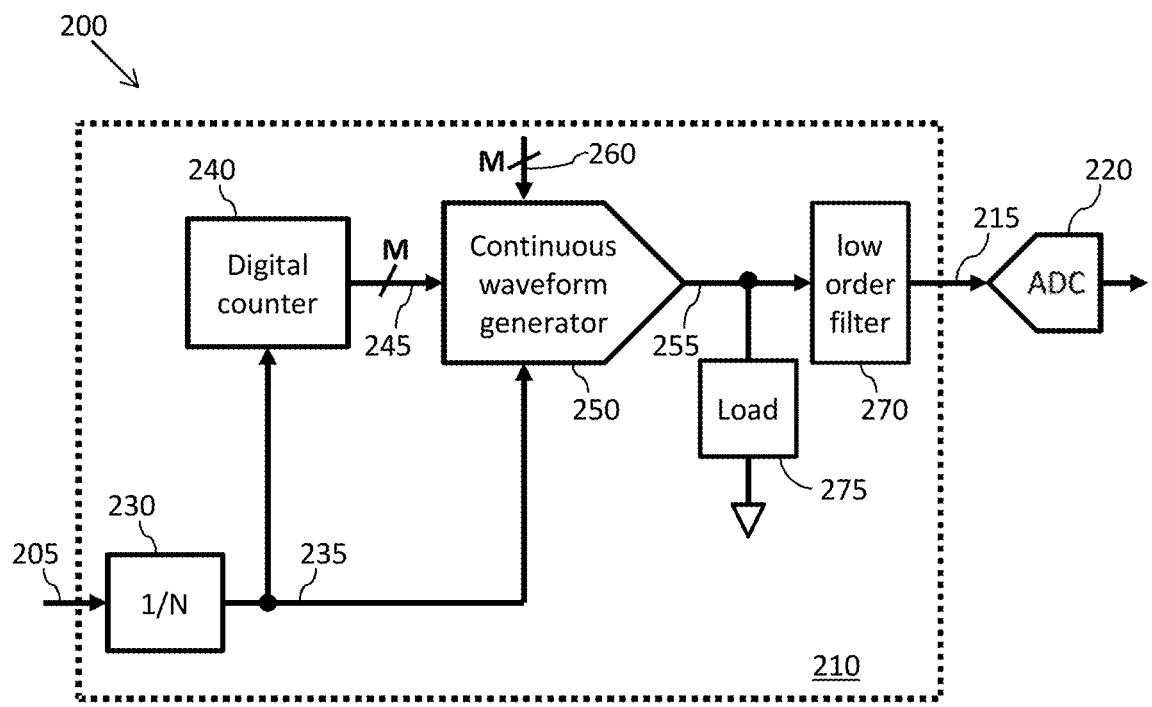
FIG. 2 illustrates a simplified block diagram of an example embodiment of a part of a frequency monitor circuit for performing run-time frequency monitoring of an input frequency signal.

Referring first to FIG. 2 there is illustrated a simplified block diagram of an example embodiment of a part of a frequency monitor circuit 200 for performing run-time frequency monitoring of an input frequency signal 205. For example, the frequency monitor circuit 200 may be arranged to perform run-time frequency monitoring of an oscillator signal for a Frequency-Modulated Continuous Wave (FMCW) automotive radar system. However, it is contemplated that the frequency monitor circuit 200 may equally be used in other types of systems that require frequency monitoring or measurement.

In the example embodiment illustrated in FIG. 2, the frequency monitor circuit 200 comprises a frequency estimation signal generator component 210 arranged to receive the input frequency signal 205 and to generate therefrom a frequency estimation signal 215 from which a frequency of the input frequency signal 205 may be estimated. In the illustrated example, the frequency estimation signal 215 comprises an analogue signal which is provided to an analogue-to-digital converter 220 which digitizes the frequency estimation signal 215 for further digital signal processing to estimate the frequency of the input frequency signal 205.

The frequency estimation signal generator component 210 comprises a counter component 240 arranged to receive an oscillating signal 235 derived from the input frequency signal 205. In the example embodiment illustrated in FIG. 2, the oscillating signal 235 is derived by a divider component 230 arranged to receive the input frequency signal 205 and to perform frequency division of the input frequency signal 205 to generate the oscillating signal 235 received by the counter component 240. Accordingly, in the illustrated example the divider component 230 is arranged to divide the frequency of the input frequency signal 205 by N, and the oscillating signal 235 received by the counter component 240 comprises a fundamental frequency equal to 1/N the frequency of the input frequency signal 205.

The counter component 240 is arranged to output a plurality of digital control signals 245. The counter component 240 is further arranged to output a sequence of k control signal patterns, and is controllable by the received oscillating signal 235 to sequentially step through the k control signal patterns. For example, and as described in greater detail below, the counter component 240 may be arranged to sequentially step through the k control signal patterns upon every n cycle(s) of the received oscillating signal 235, where n≥1. In the manner, the counter component 240 may be arranged to cycle through the sequence of k control signal patterns once every n*k cycles of the oscillating signal 235.

The frequency estimation signal generator 210 further comprises a continuous waveform generator component 250 arranged to receive the M digital control signals 245 output by the counter component 240 and a weighted analogue signal 260 for each of the received digital control signals 245 (thus M weighted analogue signals 260), and to output a continuous waveform signal 255 comprising a sum of the weighted analogue signals 260 for which the corresponding digital control signals 245 comprise an asserted logical state. In this manner, the continuous waveform signal 255 output by the continuous waveform generator 250 will have a repetitive profile that repeats each cycle of the sequence of k control signal patterns.

In some example embodiments, the weighted analogue signals 260 comprise weighted current signals, and the continuous waveform signal 255 output by the continuous waveform generator 250 comprises a continuous summed current signal applied to a resistive load 275 that converts the continuous summed current signal into a continuous waveform voltage signal 255 at the output of the continuous waveform generator 250. For some alternative embodiments, it is contemplated that the weighted analogue signals 260 may alternatively comprise weighted signals in charge form or weighted voltage signals, and the continuous waveform signal 255 output by the continuous waveform generator 250 comprises a summed continuous voltage waveform signal.

The frequency conversion component 210 is arranged to derive the frequency estimation signal 215 from the continuous waveform signal 255 output by the continuous waveform generator component 250. As illustrated in FIG. 2, the frequency conversion component 210 may further comprise a low-order filter 270 arranged to perform low-order filtering of the continuous waveform signal 255 output by the continuous waveform generator component 250 to derive the frequency estimation signal 215.

In some example embodiments, such as described in greater detail below, the sequence of control signal patterns generated by the counter component 240 and the weighted analogue signals 260 are arranged such that the continuous waveform signal 255 output by the continuous waveform generator 250 comprises a substantially sinusoidal profile.

Figure 3:
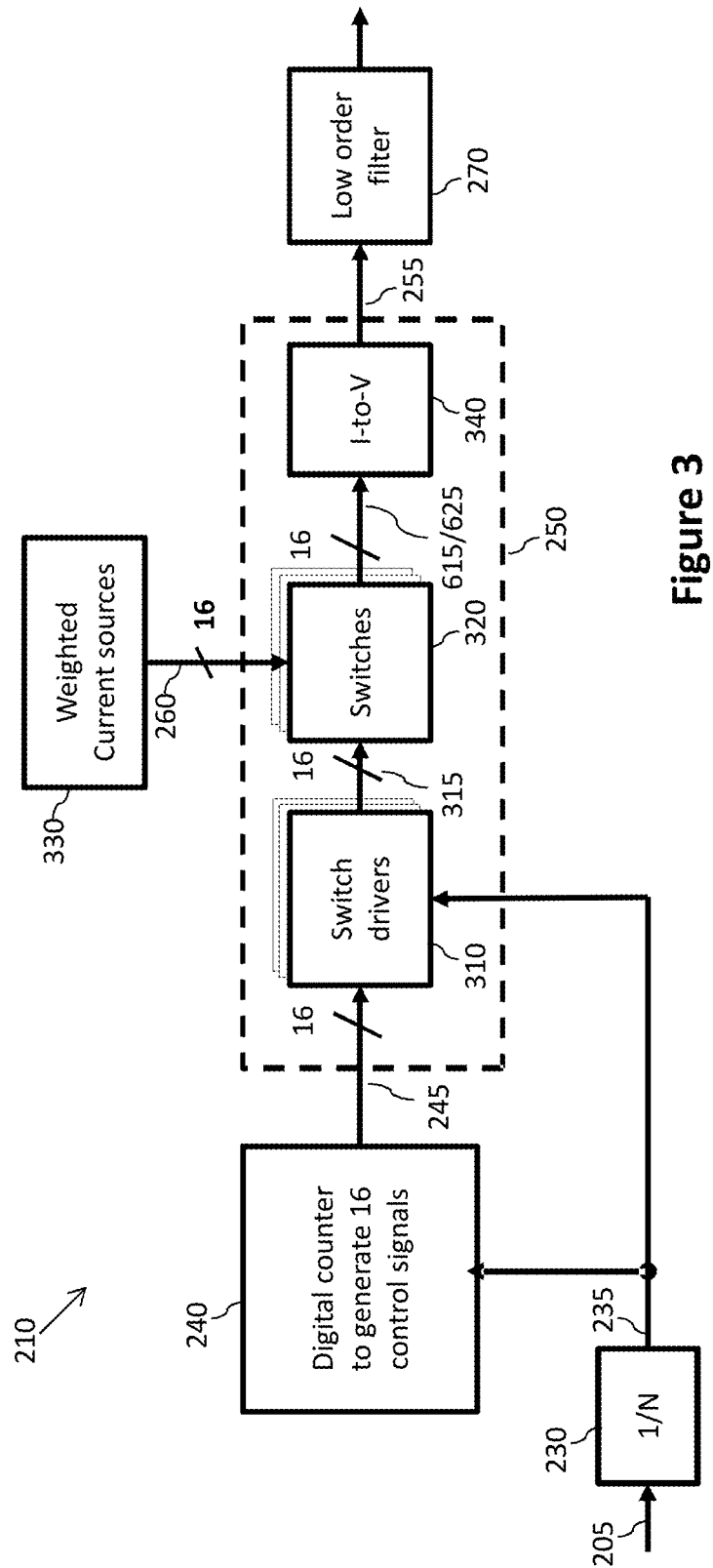
FIG. 3 illustrates a simplified block diagram of the frequency conversion component of FIG. 2 showing an example implementation of the continuous waveform generator component in greater detail.

FIG. 3 illustrates a simplified block diagram of the frequency conversion component 210 showing an example implementation of the continuous waveform generator component 250 in greater detail. The counter component 240 arranged to receive the oscillating signal 235 derived by the divider component 230 from the input frequency signal 205, and to sequentially output a sequence of k control signal patterns upon every n cycle(s) of the received oscillating signal 235.

Figure 4:
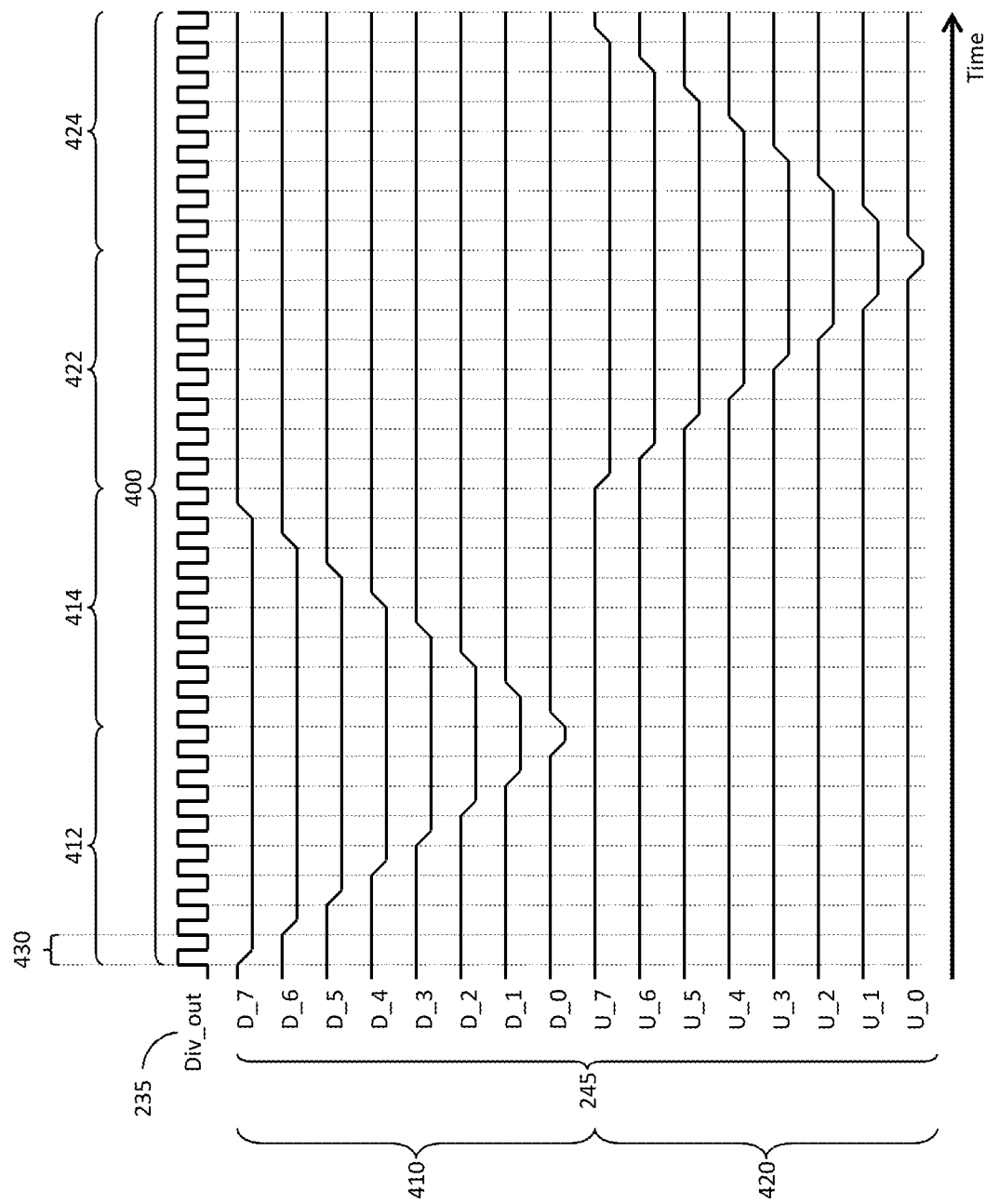
FIG. 4 illustrates an example of a sequence of control signal patterns.

FIG. 4 illustrates an example of a sequence 400 of control signal patterns that may be generated by the counter component 240. In the examples illustrated in FIGS. 3 and 4, the counter component 240 is arranged to output a set of M digital control signals 245 made up of a first subset 410 of M/2 'down' control signals, labelled D_0 to D_7, and a second subset 420 of M/2 'up' control signals, labelled U_0 to U_7. In the illustrated example M=16. Each cycle 430 of the oscillating signal 235 output by the divider component 230 the logical state of one of the control signals 245 is transitioned, either from an asserted logical state to an un-asserted logical state or from an un-asserted logical state to an asserted logical state. Each control signal 245 is transitioned from an un-asserted logical state to an asserted logical state and from an asserted logical state to an un-asserted logical state once within the sequence 400 of control signal patterns. Thus, the sequence 400 comprises 32 control signal patterns (2*16) and a complete cycle of the sequence 400 of control signal patterns occurs over 32 cycles 430 of the oscillating signal 235 output by the divider component 230.

In the example illustrated in FIG. 4, the sequence 400 of control signal patterns comprises:

a down asserting phase 412 during which the subset 410 of down control signals are sequentially transitioned from un-asserted states to asserted states;

a down de-asserting phase 414 during which the subset 410 of down control signals are sequentially transitioned from asserted states to un-asserted states;

an up asserting phase 422 during which the subset 420 of up control signals are sequentially transitioned from un-asserted states to asserted states; and an up de-asserting phase 424 during which the subset 420 of up control signals are sequentially transitioned from asserted states to un-asserted states.

At the start of the down asserting phase 412, a first control signal D_7 from the subset 410 of down control signals is transitioned from an un-asserted logical state (which in the illustrated example comprises a 'high' state) to an asserted logical state (which in the illustrated example comprises a 'low' state) and all other control signals are maintained at an un-asserted logical state. Accordingly for the first control signal pattern in the down asserting phase 412 of the sequence 400 of control signal patterns, the first control signal D_7 from the subset 410 of down control signals is asserted whilst all other control signals are un-asserted. For each subsequent control signal pattern in the down asserting phase 412 of the sequence 400 of control signal patterns, one more of the control signals from the subset 410 of down control signals is transitioned from an un-asserted logical state to an asserted logical state until all of the control signals from the subset 410 of down control signals are asserted, in the eighth control signal pattern of the down asserting phase 412 of the sequence 400 of control signal patterns.

During the down de-asserting phase 414, the control signals from the subset 410 of down control signals are sequentially transitioned to the un-asserted logical state in the reverse order in which they were transitioned to the asserted logical state during the down asserting phase 412; one control signal being transitioned between each control signal pattern, until all control signals are once again in un-asserted logical states.

At the start of the up asserting phase 422, a first control signal U_7 from the subset 420 of up control signals is transitioned from an un-asserted logical state (which in the illustrated example comprises a 'high' state) to an asserted logical state (which in the illustrated example comprises a 'low' state) and all other control signals are maintained at an un-asserted logical state. Accordingly for the first control signal pattern in the up asserting phase 422 of the sequence 400 of control signal patterns, the first control signal U_7 from the subset 420 of up control signals is asserted whilst all other control signals are un-asserted. For each subsequent control signal pattern in the up asserting phase 422 of the sequence 400 of control signal patterns, one more of the control signals from the subset 420 of up control signals is transitioned from an un-asserted logical state to an asserted logical state until all of the control signals from the subset 420 of up control signals are asserted, in the eighth control signal pattern of the up asserting phase 422 of the sequence 400 of control signal patterns.

During the up de-asserting phase 424, the control signals from the subset 420 of up control signals are sequentially transitioned to the un-asserted logical state in the reverse order in which they were transitioned to the asserted logical state during the up asserting phase 422; one control signal being transitioned between each control signal pattern, until all control signals are once again in un-asserted logical states.

Figure 5:
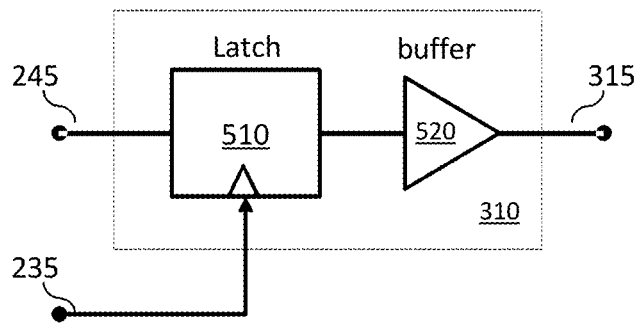
FIG. 5 illustrates a simplified block diagram of one example of a switch driver.

Referring back to FIG. 3, in this illustrated example the continuous waveform generator component 250 comprises a set of switch drivers 310. For example, in FIG. 3 the counter component 240 is arranged to output M (e.g. sixteen) digital control signals 245. Accordingly, the continuous waveform generator component 250 of FIG. 3 may comprise M (e.g. sixteen) switch drivers 310, one for each control signal 245. FIG. 5 illustrates a simplified block diagram of one example of such a switch driver 310. In the example illustrated in FIG. 5, the switch driver 310 comprises a latch component 510 arranged to receive at a data input thereof one of the control signals 245, and the oscillating signal 235 output by the divider component 230 as a clock signal. The output of the latch component 510 is provided to an input of a buffer 520, which outputs a driver signal 315 for the switch driver 310. In this manner, each switch driver 310 is arranged to generate a driver signal 315 corresponding to the received control signal 245, with the oscillating signal 235 being used to synchronise the driver signals 315 output by the switch drivers 310.

Referring back to FIG. 3, the driver signals 315 output by the switch drivers 310 are provided to a set of switching components 320, the switching components 230 being arranged to receive the driver signals 315 output by the switch drivers 310 and the weighted analogue signals 260 and to collectively generate the continuous waveform signal 255 comprising a sum of the weighted analogue signals 260 for which the corresponding driver signals 315 comprise an asserted logical state.

Figure 6:
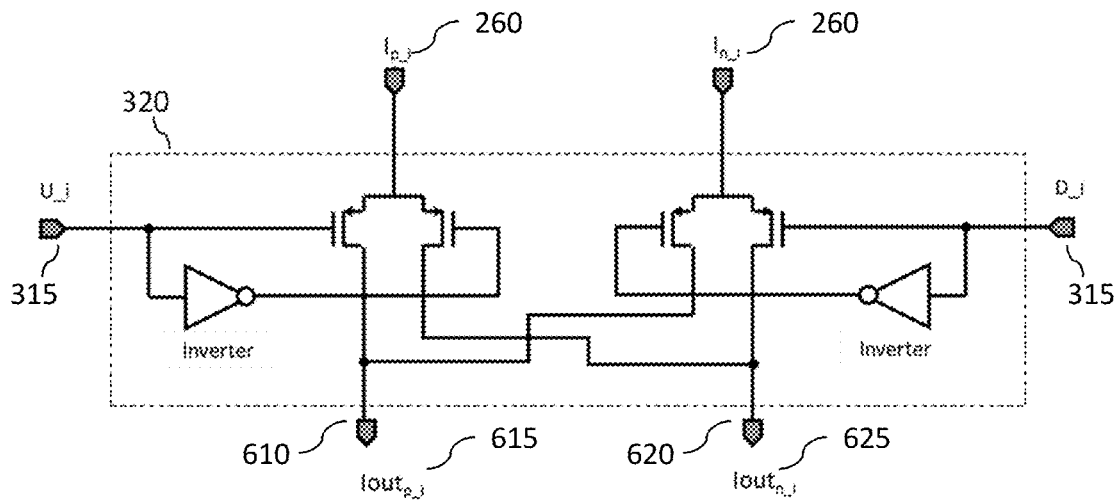
FIG. 6 schematically illustrates a simplified diagram of one example of a switching component.

FIG. 6 schematically illustrates a simplified diagram of one example of such a switching component 320. In particular, FIG. 6 illustrates a switching component 320 comprises a tri-state operation and is arranged to receive a pair of driver signals 315 and a pair of weighted current signals 260, and to steer the current signals to a first output 610, a second output 620 or to both outputs 610, 620, depending on the received driver signals 315.

For example, each switching component 320 may be arranged to receive a pair of driver signals 315 generated from an up control signal U_i from the subset 420 of up control signals and a corresponding down control signal D_i from the subset 410 of down control signals. Table 1 below illustrates the tri-state operation for the example switching component 320 of FIG. 5.

TABLE 1

Tri-state operation of switching component

| U_i | D_i | Iout$_{p\_i}$ | Iout$_{n\_i}$ |
|---|---|---|---|
| 0 | 0 | $I_{p\_i}$ | $I_{n\_i}$ |
| 0 | 1 | 0 | $I_{p\_i} + I_{n\_i}$ |
| 1 | 0 | $I_{p\_i} + I_{n\_i}$ | 0 |
| 1 | 1 | $I_{n\_i}$ | $I_{p\_i}$ |

Figure 7:
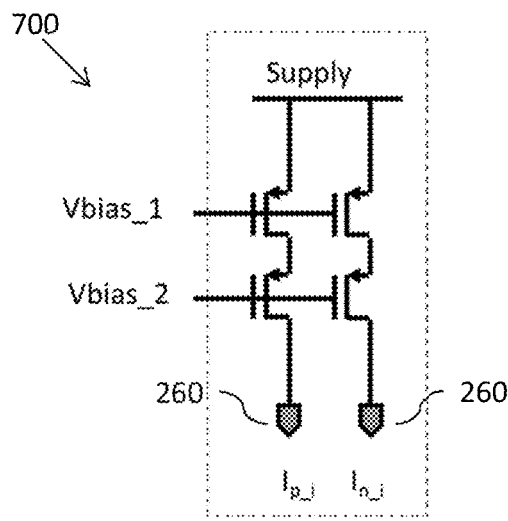
FIG. 7 illustrates a simplified diagram of an example of a split current source.

In some examples, the received weighted current signals 260 may comprise equally weighted current signals, for example generated by a split current source, such as the split current source 700 illustrated in FIG. 7. Accordingly, the frequency estimation signal generator component 210 illustrated in FIG. 3 may comprise a weighted current sources 330 in the form of eight split current sources 700, each arranged to output a pair of equally weighted current signals to a corresponding switching component 320.

Referring back to FIG. 6, as outlined above the switching component 320 is arranged to steer the weighted current signals 260 between a first output 610 and a second output 620, depending on the received driver signals 315. In this manner a first output current signal 615 is generated at the first output 610 of the switching component 320 and a second output current signal 625 is generated at the second output 620 of the switching component 320. In accordance with some example embodiments, the output current signals 615, 625 generated by the switching component 320 may comprise a pair of complementary up and down current signals 615, 625.

Figure 8:
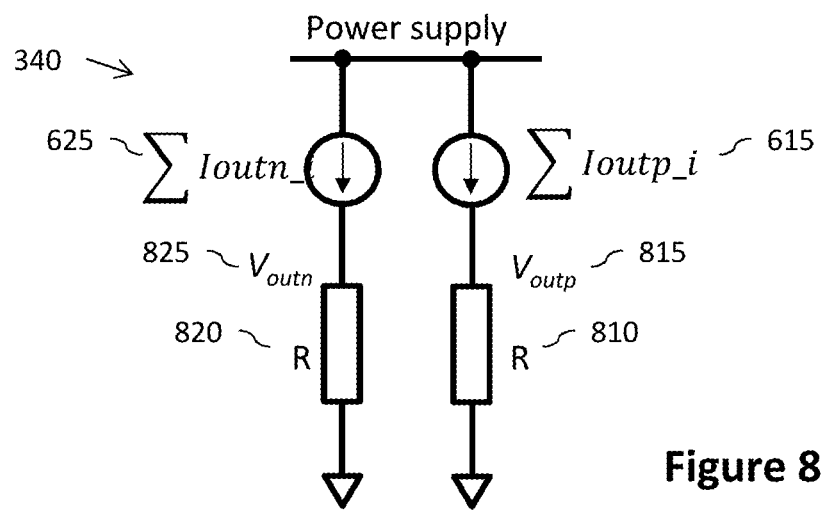
FIG. 8 illustrates a simplified diagram of an example implementation of a current-to-voltage converter circuit.

Referring back to FIG. 3, the output currents 615, 625 generated by the switching components 320 may then be converted to a voltage signal, for example by a current to voltage converter circuit 340. FIG. 8 illustrates a simplified diagram of an example implementation of such a current-to-voltage converter circuit 340. In the illustrated example, the up current signals 615 from the switching components 320 are combined and collectively routed through a first resistance 810 to generate an 'up' voltage signal $V_{outp}$ 815 across the first resistance 810, whilst the down current signals 625 from the switching components 320 are combined and collectively routed through a second resistance 820 to generate a 'down' voltage signal $V_{outm}$ 825 across the second resistance 820. The difference between the up and down voltage signals 815, 825 may then used to generate to an output voltage waveform $V_{out}$ For example, where the first and second resistances 810, 820 are equal, the output voltage $V_{out}$ may be expressed as:

$$V_{out} = V_{outm} - V_{outp} = R * \Sigma_{i=0}^{7}((Iout_{p_i}) - (Iout_{n_i}))$$  Equation 1

Figure 9:
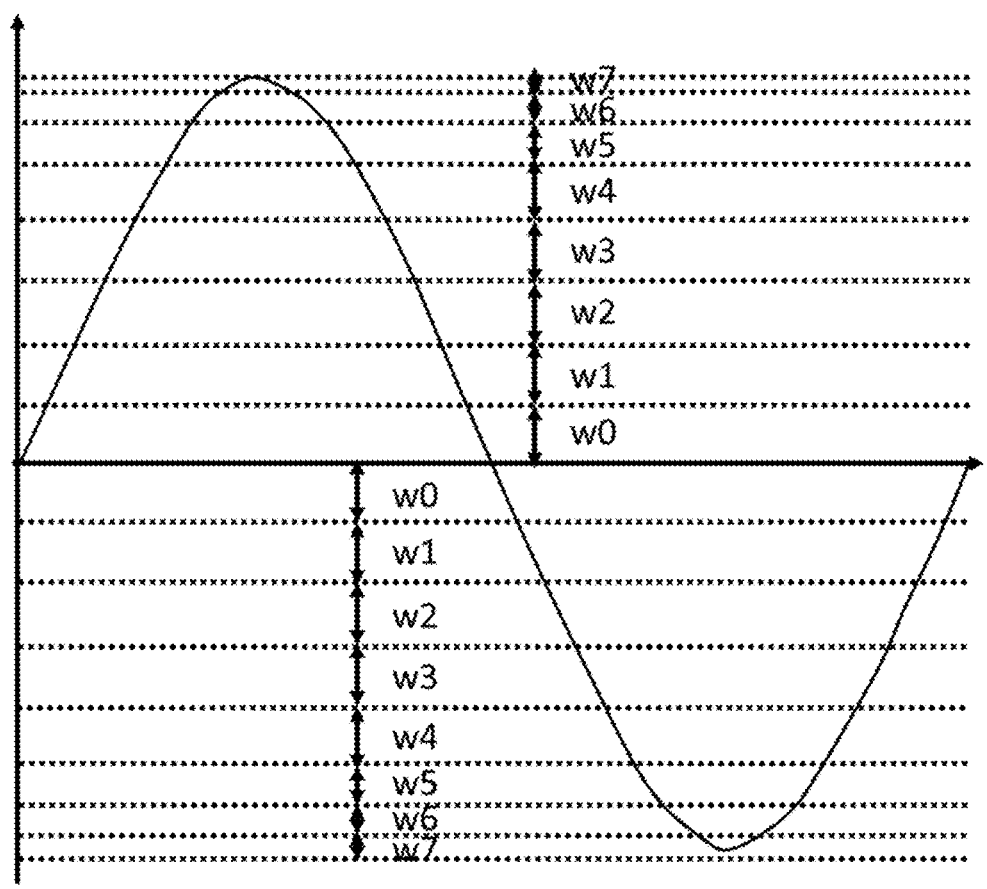
FIG. 9 illustrates a plot of an example output voltage from a current-to-voltage converter circuit in response to the sequence of control signal patterns illustrated in FIG. 4.

FIG. 9 illustrates a plot of an example output voltage from the current-to-voltage converter circuit 340 in response to the sequence 400 of control signal patterns illustrated in FIG. 4 that may be generated by the counter component 240. For the example output voltage illustrated in FIG. 9, the current signals 260 provided to the switching components 320 have been progressively weighted by factors W0 to W7. For example, to achieve a normalised output voltage ranged from −1 to 1, the current signals 260 may be progressively weighted by [0.1951 0.1876 0.1729 0.1515 0.1244 0.0924 0.0569 0.0192]. Notably, by multiplying the control signals 245 output by the counter component 240 with the progressively weighted current signals 260, and summing the resulting currents, a continuous waveform may be generated that resembles a zero-order hold reconstructed sin wave.

Significantly, the mixed-signal approach herein described enables the suppression of undesired harmonics of the divider component 230, thereby significantly relaxing any subsequent filtering requirements. The output signal 255 of the frequency estimation signal generator component 210 comprises a repeating waveform having a cycle equal to that of the sequence of control signal patterns generated by the counter component 240, and thus equal to n*k cycles of the oscillating signal 235; i.e. equal to N*n*k cycles of the input frequency signal 205. Thus, the fundamental tone of the oscillating signal 235 output by the divider component 230 is preserved while its harmonic tones are greatly suppressed (the choice of the pre-defined weights determining how much the harmonic tones can be suppressed). By selecting a proper number of points (with equal spacing in time domain) for reconstructing a sin wave (i.e. the number of control signal patterns within the sequence), the only unwanted tones (image tones due to the zero-order hold function) that need to be suppressed may be located at much higher frequencies and can be filtered using a simple low order analogue filter, such as illustrated at 270, (for example just a simple first order RC filter).

Figure 10:
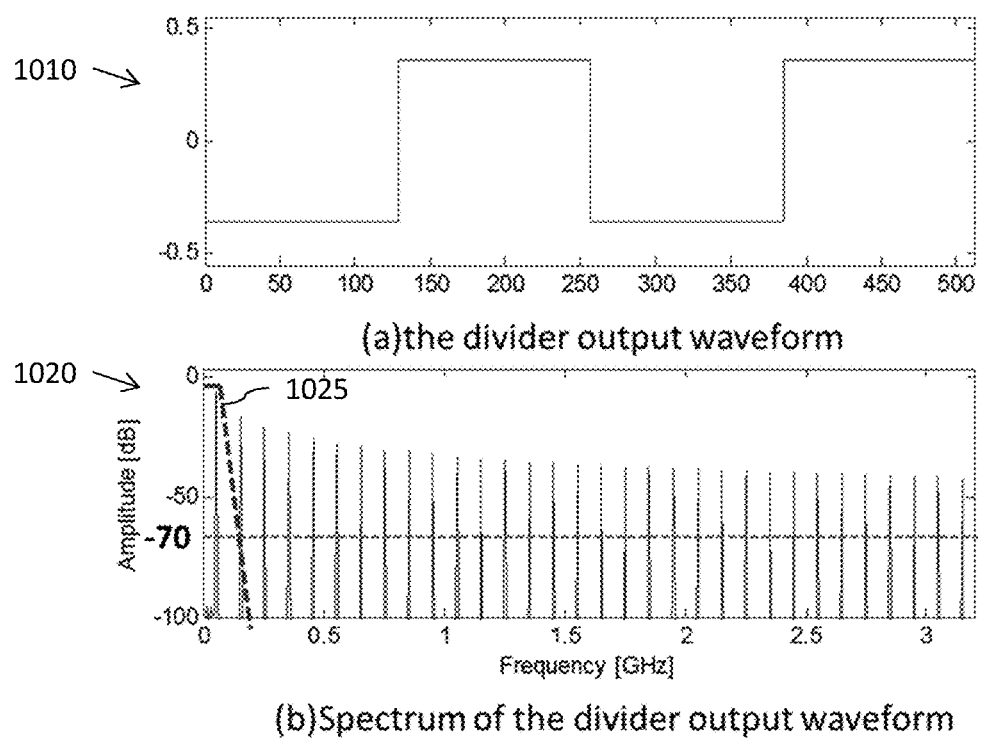
FIG. 10 illustrates a first plot showing an example waveform output by a divider component, and a second plot illustrating the frequency spectrum for the waveform of the first plot.
Figure 11:
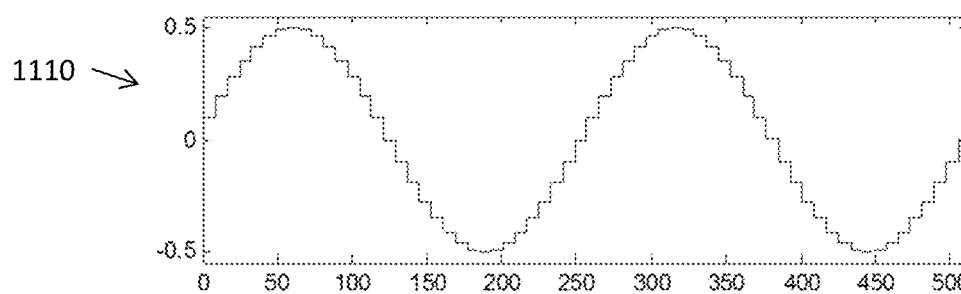
FIG. 11 illustrates a first plot showing an example sinusoidal waveform output by a frequency estimation signal generator component in response to the example waveform output by the divider component in the first plot of FIG. 10, and a second plot illustrating the frequency spectrum for the waveform of the first plot of FIG. 11.
Figure 11:
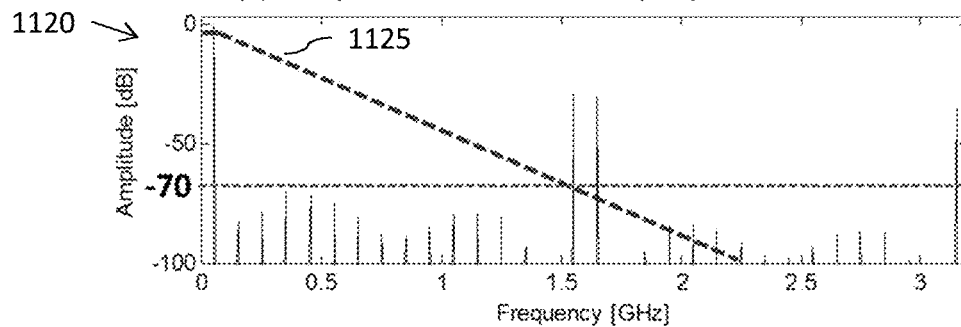

For example, FIG. 10 illustrates a first plot 1010 showing an example waveform output by the divider component 230, and a second plot 1020 illustrating the frequency spectrum for the waveform of the first plot 1010. The attenuation required to achieve the stringent 70 dB suppression on the $3^{rd}$ harmonic for FMCW automotive radar systems is illustrated by the broken line at 1025. FIG. 11 illustrates a first plot 1110 showing an example 32 points/cycle sinusoidal waveform output by the frequency estimation signal generator component 210 in response to the example waveform output by the divider component 230 in the first plot 1010 of FIG. 10, and a second plot 1120 illustrating the frequency spectrum for the waveform of the first plot 1110. As shown in this example, the harmonic tones of the waveform output by the divider component 230 have been greatly suppressed within the sinusoidal waveform output by the frequency estimation signal generator component 210. Accordingly, the image tones sinusoidal waveform output by the frequency estimation signal generator component 210 (illustrated in the second plot 1120 in FIG. 11) are spaced far away from the fundamental tone (more than 30 times the fundamental frequency in this example) which greatly relaxes the filter requirements for the stringent 70 dB suppression on the $3^{rd}$ harmonic for FMCW automotive radar systems as illustrated by the broken line at 1125.

Advantageously, because of the reduced filtering requirements, and the reduced sensitivity to process variation, a frequency monitor circuit for performing run-time frequency monitoring of an input signal, such as the frequency monitor circuit illustrated in FIG. 2, may be implemented in CMOS (complementary metal oxide semiconductor) technology, and thus integrated with other components of, for example, a radar system. As a result, the proposed solution can help to realize a cost effective single chip solution.

Figure 12:
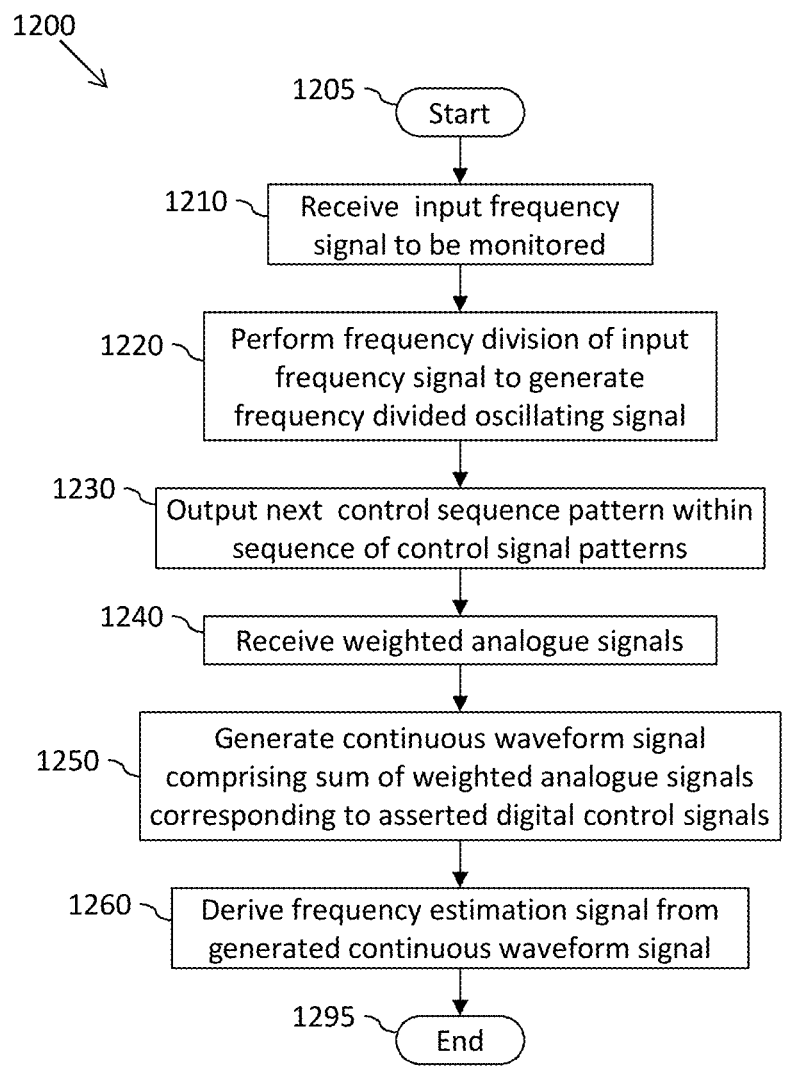
FIG. 12 illustrates a simplified flowchart of an example of a method of generating a frequency estimation signal for performing run-time frequency monitoring of an input signal.

Referring now to FIG. 12, there is illustrated a simplified flowchart 1200 of an example of a method of generating a frequency estimation signal for performing run-time frequency monitoring of an input signal, for example an oscillator signal for a RMCW automotive radar system, such as may be implemented within the frequency estimation signal generator component 210 hereinbefore described. The method of FIG. 12 starts at 1205 and moves on to 1210 where in input frequency signal is received, such as the input frequency signal 205 illustrated in FIGS. 2 and 3. In the illustrated example, frequency division is then performed on the received input frequency signal at 1220 to derive an oscillating signal, such as the oscillating signal 235 illustrated in FIGS. 2 and 3. Sequentially outputting a sequence of control signal patterns, such as the sequence of control signal patterns 400 illustrated in FIG. 4, over a plurality of digital control signals at 1230 under the control of the oscillating signal derived from the received input frequency signal. Weighted analogue signals are received at 1240, and a continuous waveform signal is output at 1250 comprising a sum of the weighted analogue signals for which the corresponding digital control signals comprise an asserted logical state. The frequency estimation signal may then be then derived from the continuous waveform signal at 1260, and the method ends at 1295.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'un-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A frequency estimation signal generator component arranged to receive an input frequency signal and to generate therefrom a frequency estimation signal, the frequency estimation signal generator component comprising:
  a counter component arranged to receive an oscillating signal derived by dividing the input frequency signal with a divider component and to output a plurality of physically separate digital control signals, wherein the counter component is arranged to output a temporal sequence of control signal patterns for each of the physically separate digital control signals and is controllable by the received oscillating signal to sequentially step through the control signal patterns; and
  a continuous waveform generator component arranged to receive the plurality of physically separate digital control signals output by the counter component and a weighted analogue signal for each of the received physically separate digital control signals, and to output a continuous waveform sinusoidal signal comprising a sum of the weighted analogue signals for which the corresponding physically separate digital control signals comprise an asserted logical state;

wherein the frequency conversion component is arranged to derive the frequency estimation signal from the continuous waveform sinusoidal signal output by the continuous waveform generator component.

2. The frequency estimation signal generator component of claim 1, wherein the counter component is arranged to sequentially step through the control signal patterns upon every n cycle(s) of the received oscillating signal, where $n \geq 1$.

3. The frequency estimation signal generator component of claim 1, wherein the counter component is arranged to output a set of M digital control signals made up of a first subset of M/2 down control signals, and a second subset of M/2 up control signals.

4. The frequency estimation signal generator component of claim 3, wherein the counter component is arranged to generate the sequence of control signal patterns comprising:
a down asserting phase during which the subset of down control signals are sequentially transitioned from un-asserted states to asserted states;
a down de-asserting phase during which the subset of down control signals are sequentially transitioned from asserted states to un-asserted states;
an up asserting phase during which the subset of up control signals are sequentially transitioned from un-asserted states to asserted states; and
an up de-asserting phase during which the subset of up control signals are sequentially transitioned from asserted states to un-asserted states.

5. The frequency estimation signal generator component of claim 3, wherein the continuous waveform generator component comprises:
a set of M switch drivers, each switch driver arranged to receive one of the control signals output by the counter component and to output a driver signal derived from the received control signal; and
a set of switching components arranged to receive the driver signals output by the switch drivers and the weighted analogue signals and to collectively generate the continuous waveform signal comprising a sum of the weighted analogue signals for which the corresponding driver signals comprise the asserted logical state.

6. The frequency estimation signal generator component of claim 5, wherein each switching component comprises a tri-state operation and is arranged to receive a pair of driver signals and a pair of weighted analogue signals, and to steer the weighted analogue signals to an up output, a down output or to both outputs, depending on the received driver signals.

7. The frequency estimation signal generator component of claim 6, wherein each switching component is arranged to receive a pair of driver signals derived from complementary up and down control signals and a pair of equally weighted analogue signals.

8. The frequency estimation signal generator component of claim 5, wherein:

the analogue signals at the up outputs of the set of switching components are combined to generate an up voltage signal;
the analogue signals at the down outputs of the set of switching components are combined to generate a down voltage signal; and
the continuous waveform signal is generated based on the resulting up and down voltage signals.

9. The frequency estimation signal generator component of claim 1, wherein the sequence of control signal patterns generated by the counter component and the weighted analogue signals are arranged such that the continuous waveform signal output by the continuous waveform generator comprises a sinusoidal profile.

10. The frequency estimation signal generator component of claim 1, wherein the weighted analogue signals comprise weighted current signals, and the continuous waveform signal output by the continuous waveform generator comprises a continuous summed current signal applied to a load to convert the continuous summed current signal into a continuous waveform voltage signal.

11. The frequency estimation signal generator component of claim 1, wherein the frequency estimation signal generator component further comprises a divider component arranged to receive the input frequency signal and to perform frequency division of the input frequency signal to generate the oscillating signal received by the counter component.

12. The frequency estimation signal generator component of claim 1, wherein the frequency estimation signal generator component further comprises a low-order filter arranged to perform low-order filtering of the frequency estimation signal.

13. A frequency monitor circuit for performing run-time frequency monitoring of an input signal, the frequency monitor circuit comprising at least one frequency estimation signal generator component according to claim 1.

14. The frequency monitor of claim 13, wherein the frequency monitor circuit is arranged to perform run-time frequency monitoring of an oscillator signal for a Frequency-Modulated Continuous Wave, FMCW, automotive radar system.

15. A method of generating a frequency estimation signal for performing run-time frequency monitoring of an input frequency signal, the method comprising:
receiving the input frequency signal;
sequentially outputting a temporal sequence of control signal patterns over a plurality of physically separate digital control signals under the control of an oscillating signal derived by dividing the received input frequency signal;
receiving a weighted analogue signal for each of the physically separate digital control signals;
outputting a continuous waveform sinusoidal signal comprising a sum of the weighted analogue signals for which the corresponding physically separate digital control signals comprise an asserted logical state; and
deriving the frequency estimation signal from the continuous waveform sinusoidal signal.

\* \* \* \* \*